(12) United States Patent
Koduri et al.

(10) Patent No.: US 11,239,195 B2
(45) Date of Patent: Feb. 1, 2022

(54) NANOWIRE INTERFACES

(71) Applicant: TEXAS INSTRUMENTS INCORPORATED, Dallas, TX (US)

(72) Inventors: Sreenivasan Kalyani Koduri, Allen, TX (US); Benjamin Stassen Cook, Los Gatos, CA (US); Ralf Jakobskrueger Muenster, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 16/843,580

(22) Filed: Apr. 8, 2020

(65) Prior Publication Data

US 2020/0321303 A1    Oct. 8, 2020

Related U.S. Application Data

(60) Provisional application No. 62/831,010, filed on Apr. 8, 2019.

(51) Int. Cl.
| | |
|---|---|
| *H01L 23/31* | (2006.01) |
| *H01L 21/78* | (2006.01) |
| *H01L 23/495* | (2006.01) |
| *H01L 23/00* | (2006.01) |

(52) U.S. Cl.
CPC ............. *H01L 24/29* (2013.01); *H01L 21/78* (2013.01); *H01L 23/3121* (2013.01); *H01L 23/4951* (2013.01); *H01L 24/27* (2013.01); *H01L 24/32* (2013.01); *H01L 24/40* (2013.01); *H01L 24/48* (2013.01); *H01L 24/73* (2013.01); *H01L 24/83* (2013.01); *H01L 24/94* (2013.01); *H01L 2224/2746* (2013.01); *H01L 2224/29082* (2013.01); *H01L 2224/29355* (2013.01); *H01L 2224/29364* (2013.01); *H01L 2224/29499* (2013.01); *H01L 2224/32245* (2013.01); *H01L 2224/40245* (2013.01); *H01L 2224/48091* (2013.01); *H01L 2224/48106* (2013.01); *H01L 2224/48245* (2013.01); *H01L 2224/73221* (2013.01); *H01L 2224/73263* (2013.01); *H01L 2224/73265* (2013.01)

(58) Field of Classification Search
CPC .......... H01L 2224/37572; H01L 24/03; H01L 2224/29082; H01L 2224/04034
See application file for complete search history.

(56) References Cited

U.S. PATENT DOCUMENTS

| | | | | |
|---|---|---|---|---|
| 8,912,637 | B1 * | 12/2014 | Zhang | H01L 24/83 257/676 |
| 2015/0069600 | A1 * | 3/2015 | Zhang | H01L 24/05 257/734 |

* cited by examiner

*Primary Examiner* — Dale E Page
*Assistant Examiner* — Wilner Jean Baptiste
(74) *Attorney, Agent, or Firm* — Ronald O. Neerings; Charles A. Brill; Frank D. Cimino (57) ABSTRACT

In some examples, a system comprises a first component having a first surface, a first set of nanoparticles coupled to the first surface, and a first set of nanowires extending from the first set of nanoparticles. The system also comprises a second component having a second surface, a second set of nanoparticles coupled to the second surface, and a second set of nanowires extending from the second set of nanoparticles. The system further includes an adhesive positioned between the first and second surfaces. The first and second sets of nanowires are positioned within the adhesive.

22 Claims, 11 Drawing Sheets

NANOWIRE INTERFACES

CROSS-REFERENCE TO RELATED APPLICATIONS

The present application claims priority to U.S. Provisional Patent Application No. 62/831,010, which was filed Apr. 8, 2019, is titled "Semiconductor Devices with Improved Reliability," and is hereby incorporated herein by reference in its entirety.

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame die pad. The assembly is later covered by a mold compound, such as epoxy, to protect the assembly from potentially damaging heat, physical trauma, moisture, and other deleterious factors. The finished assembly is called a semiconductor package or, more simply, a package.

SUMMARY

In some examples, a system comprises a first component having a first surface, a first set of nanoparticles coupled to the first surface, and a first set of nanowires extending from the first set of nanoparticles. The system also comprises a second component having a second surface, a second set of nanoparticles coupled to the second surface, and a second set of nanowires extending from the second set of nanoparticles. The system further includes an adhesive positioned between the first and second surfaces. The first and second sets of nanowires are positioned within the adhesive.

In some examples, a method comprises forming a first metal layer on a semiconductor wafer, plating a first set of nanowires on the first metal layer, and singulating the semiconductor wafer to produce a semiconductor die. The method also comprises forming a second metal layer on a die pad, plating a second set of nanowires on the second metal layer, and coupling the semiconductor die to the die pad using an adhesive such that the first and second sets of nanowires are positioned within the adhesive.

BRIEF DESCRIPTION OF THE DRAWINGS

For a detailed description of various examples, reference will now be made to the accompanying drawings in which:

FIGS. 2A1-2G2 depict a process flow for fabricating part of a nanowire interface on a semiconductor wafer, in accordance with various examples;

DETAILED DESCRIPTION

Various components are included within semiconductor packages, including dies, die pads, leads, bond wires, clips, passive components (e.g., resistors, capacitors, inductors), and any of a variety of other such components. These components are often, if not typically, made of differing materials. For instance, dies may primarily comprise silicon or another semiconductor; die pads and leads may include copper or another metal; bond wires may be composed of gold, copper, or another metal; and die attaches may comprise epoxy or solder. These components may be covered by a mold compound, such as a silica plastic-filled mold compound. During fabrication, these components are integrated into a semiconductor package at high temperatures, and the package experiences a range of temperatures throughout its life cycle. During the life cycle of the package, the mismatched coefficients of thermal expansion (CTEs) of the various components cause stress to the contact points (e.g., adhesives) between the components, thereby compromising the mechanical integrity of the adhesion. In addition, moisture from the environment can infiltrate a package and settle at adhesion interfaces, and this moisture can turn into steam at high temperatures, thus further stressing the adhesion. Commonly, the mold compound or die attach separates from the die and/or the lead frame, thus causing the semiconductor package to fail.

This disclosure describes various examples of a nanowire interface that is usable as a strong adhesive between multiple components, such as a semiconductor die and a lead frame die pad. The nanowire interface is positioned between the components that are coupled to each other and includes a layer of any suitable type of adhesive, including solder, epoxy, glue, and the like. The nanowire interface further includes sets of nanowires embedded in the adhesive, with a first set of nanowires coupled to one component and a second set of nanowires coupled to the other component. In this way, the nanowires substantially increase the areas of the surfaces of the components that are to be coupled together relative to the surface areas that would be available without the use of nanowires. This increase in surface area substantially increases the strength of adhesion between the components. An increase in adhesion strength, in turn, makes it possible to use compounds in the interface that otherwise could not be used due to inadequate adhesion strength. For example, as a result of the increase in adhesion strength provided by the nanowire interface, certain compounds can be used in the interface to achieve lower toxicity, higher breakdown voltage, etc. Furthermore, the aforementioned increase in surface area also increases heat and electrical conductivity, thereby improving heat dissipation and electrical communication. Although the following examples are described primarily in the context of semiconductor packages, the scope of this disclosure is not limited as such, and instead encompasses any and all adhesive interfaces between multiple components of any and all types.

Figure 1A:
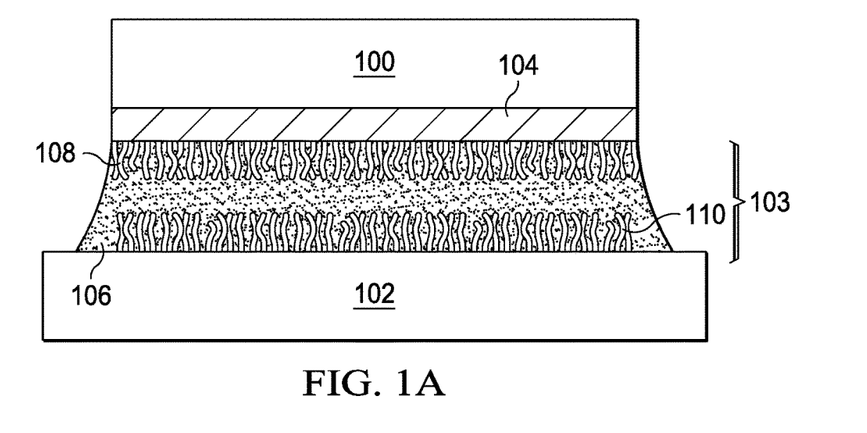
FIGS. 1A-1F depict nanowire interfaces for attaching multiple components together, in accordance with various examples.

FIGS. 1A-1F depict nanowire interfaces for attaching multiple components together, in accordance with various examples. In particular, FIG. 1A depicts a component 100 coupled to a component 102 using a nanowire interface 103. The components 100, 102 may be any two or more apparatuses in any of a variety of contexts. For example, the components may be apparatuses in an automotive context, a textile context, a consumer electronics context, a semiconductor context, etc. For example, in the semiconductor context, the component 100 may be a semiconductor die and the component 102 may be a lead frame die pad. In some examples, either or both of the components 100, 102 are metallic. In some examples, either or both of the components 100, 102 are non-metallic.

The nanowire interface 103 abuts a metal layer 104. In some examples, the metal layer 104 comprises a solid metal layer. In examples in which the metal layer 104 comprises a solid metal layer, the metal layer 104 comprises copper, titanium, or titanium-tungsten, although any of a variety of metals or alloys may be used, depending on various factors such as cost, availability, electromigration, etc. In examples in which the metal layer 104 comprises a solid metal layer, the metal layer 104 has any desired length, width, and thickness. If the metal layer 104 comprises a solid metal layer, the solid metal layer may be formed using any suitable technique, such as a printing technique, a plating technique, etc.

In some examples, the metal layer 104 comprises a set of nanoparticles. In some such examples in which the metal layer 104 comprises a set of nanoparticles, the set of nanoparticles comprises nickel palladium. However, any of a variety of metals or alloys may be used, depending on various factors including cost, electromigration between metals, availability, etc. The set of nanoparticles may be deposited on the component 100 using a printing technique, for example an additive manufacturing technique. In some examples, the set of nanoparticles is electroplated onto the component 100. In some examples, the set of nanoparticles is deposited on the component 100 using a sputtering technique. Other techniques are contemplated and included in the scope of this disclosure. Nanoparticles, once deposited, may be heated (e.g., using a laser technique or any other suitable heat source) to cause the nanoparticles to diffuse into the surface on which the nanoparticles are positioned. In the example of FIG. 1A, the nanoparticles may diffuse into the surface of component 100, thereby increasing the mechanical strength of the bond between the nanoparticles and the component 100.

In some examples, the set of nanoparticles has a thickness ranging from 100 nanometers (nm) to 100 microns, with a thicker set of nanoparticles resulting in a more mechanically stable nanowire interface 103. The remaining dimensions of the set of nanoparticles may be chosen as desired. In some examples, each nanoparticle in the set of nanoparticles is generally spherical and has a diameter ranging from approximately 0.01 microns to 1.5 microns. The specific physical parameters of the set of nanoparticles and the individual nanoparticles within the set of nanoparticles may vary, and all such variations are encompassed within the scope of this disclosure.

The nanowire interface 103 further comprises sets of nanowires 108, 110 positioned within an adhesive layer 106. Each nanowire in the sets of nanowires 108, 110 may have a length that is at least twice its diameter (e.g., a length-to-width ratio of at least 2:1). In some examples, a nanowire in the sets of nanowires 108, 110 has a length that is at least 10 times its diameter. In some examples, a nanowire in the sets of nanowires 108, 110 has a length that is at least 100 times its diameter. In some examples, a nanowire in the sets of nanowires 108, 110 has a length that is at least 1000 times its diameter. In some examples, a nanowire in the sets of nanowires 108, 110 has a diameter ranging from 0.5 microns to 1.5 microns. In some examples, a nanowire in the sets of nanowires 108, 110 has a diameter of 1 micron. In some examples, a nanowire in the sets of nanowires 108, 110 has a length of at least 2 microns. In other examples, other diameters and length-to-diameter ratios of nanowires are contemplated, and all such measurements and combinations fall within the scope of this disclosure. Example techniques for fabricating the sets of nanowires 108, 110 are described below.

The various dimensions described above for the nanowires and nanoparticles are not mere design choices. Rather, adjusting each dimension to be larger or smaller may provide specific functional benefits. For example, adjusting a nanowire length to be greater and/or a nanowire diameter to be smaller, such that the ratio of length to diameter increases, may increase the surface area of the nanowire. Increasing the surface area of the nanowire increases the number of defects present, thereby depressing the melting point of the nanowire and making it easier to fuse the nanowire to other materials without requiring high temperature or pressure.

The adhesive layer 106 comprises any suitable material that is capable of securely coupling the components 100, 102 together. For example, in the semiconductor context in which the component 100 comprises a semiconductor die and the component 102 comprises a lead frame die pad, the adhesive layer 106 may comprise a die attach material. In some examples, the adhesive layer 106 comprises solder. In some examples, the adhesive layer 106 comprises a mold compound. In some examples, the adhesive layer 106 comprises epoxy. In some examples, the adhesive layer 106 is conductive, and in other examples, the adhesive layer 106 is non-conductive or partially conductive.

The sets of nanowires 108, 110 are at least partially positioned within the adhesive layer 106, as shown. In some examples, the nanowires in the sets of nanowires 108, 110 are not straightened, meaning that they are bent at one or more points at any of a variety of angles and in any of a variety of directions. In other examples, one or more of the nanowires in the sets of nanowires 108, 110 are straightened. Because the nanowires are used to increase adhesion strength between the components 100, 102 and the adhesive layer 106, one or more bends in each nanowire prevents that nanowire from becoming dislodged, or "slipping out," from the adhesive layer 106. In this way, bends increase the adhesion strength between the components 100, 102 and the adhesive layer 106. In addition, the nanowires themselves act as additional surface area of the metal layer 104 vis-à-vis the adhesive layer 106 and of the component 102 vis-à-vis the adhesive layer 106. In this way, the nanowires further strengthen the adhesion between the components 100, 102 and the adhesive layer 106.

Figure 1B:
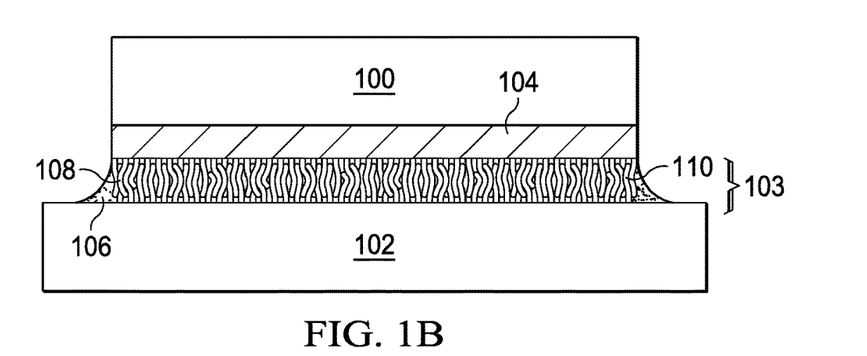

FIG. 1B depicts a structure identical to that of FIG. 1A except that one or more of the nanowires in the set of nanowires 108 directly couples to one or more nanowires in the set of nanowires 110. Such nanowires may fuse to each other by pressing them together, because at an appropriate temperature and using an appropriate pressure, the nanowires will melt due to their substantial surface areas and high number of defects along such substantial surface areas. For example, when the sets of nanowires 108, 110 are pushed together, the nanowires fuse together. In general, any two nanowires may fuse together at any point or points of contact. In examples, the fusion of two nanowires generally occurs along the lengths of the nanowires. A fusion along the lengths of two nanowires may be complete, meaning that the entire lengths of the two nanowires are fused together. In some examples, the fusion along the lengths of two nanowires may be incomplete, meaning that only portions of the lengths of the two nanowires are fused together, and these portions may be contiguous or separate. In some examples, a pair of nanowires may fuse together using a distal end of one of the nanowires in the pair. In some examples, three or more nanowires may bunch together and couple together along their lengths or in another suitable manner. In some examples, one or more nanowires may wrap around one or more other nanowires. Any and all such manners of fusion are contemplated and included within the scope of this disclosure. Fusion between nanowires may occur as a result of nanowires contacting each other with a minimum amount of pressure and/or temperature. For example, at room temperature, pressures greater than 100 MPa are sufficient to cause fusion. Temperatures of approximately 175 degrees Fahrenheit are sufficient to cause fusion without any additional pressure being added. Other combinations of pressure and temperature sufficient to cause melting and subsequent fusion of nanowires also may be used.

Accordingly, the sets of nanowires 108, 110 may be fused to each other using the aforementioned techniques, and a fluid adhesive may subsequently be flowed and cured (or otherwise caused to solidify) to form the adhesive layer 106. For instance, an injection molding system may be used to position the fluid adhesive appropriately. In this manner, the structure of FIG. 1B with fused nanowires may be fabricated.

In FIGS. 1A and 1B, the set of nanowires 108 is formed on a metal layer 104, which—as explained—may comprise a solid metal layer or a set of nanoparticles. Also in FIGS. 1A and 1B, the set of nanowires 110 is formed directly on the component 102. However, the scope of this disclosure is not limited as such. For example, the set of nanowires 110 could be formed on a metal layer that is positioned on the component 102. Alternatively or in addition, the sets of nanowires 108, 110 could be formed on sets of nanoparticles that, in turn, are positioned on solid metal layers. In some examples, one or both of the sets of nanowires 108, 110 may be formed on a set of nanoparticles that, in turn, is positioned directly on a component (e.g., component 100, 102) or on a solid metal layer positioned on a component; one or both of the sets of nanowires 108, 110 may be formed on a solid metal layer that is positioned on a component; and/or one or both of the sets of nanowires 108, 110 may be formed directly on a component (e.g., a metallic component). Any and all such variations are contemplated and included in the scope of this disclosure. FIGS. 1C-1F, now described, depict some such variations.

Figure 1C:
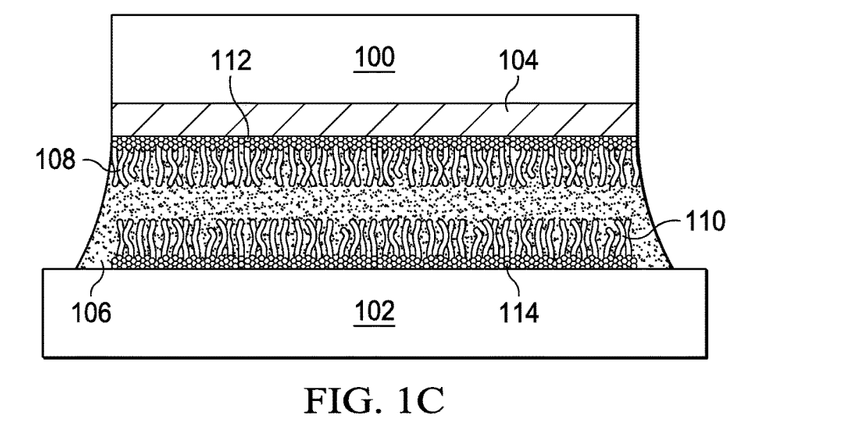
Figure 1D:
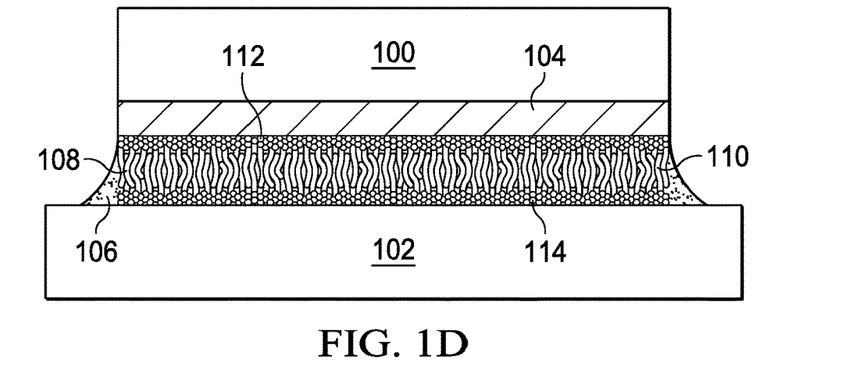

FIG. 1C depicts a structure identical to that of FIG. 1A, except that the metal layer 104 comprises a solid metal layer, that the structure comprises a set of nanoparticles 112 abutting the metal layer 104, and that the structure comprises a set of nanoparticles 114 abutting the component 102. In some examples, the sets of nanoparticles 112, 114 have physical features similar to those of the set(s) of nanoparticles described above. In some examples, the sets of nanoparticles 112, 114 are positioned on their respective surfaces in a manner similar to that described above for the aforementioned set(s) of nanoparticles. FIG. 1D depicts a structure identical to that of FIG. 1C, except that the set of nanowires 108 includes one or more nanowires that fuses to one or more nanowires in the set of nanowires 110.

Figure 1E:
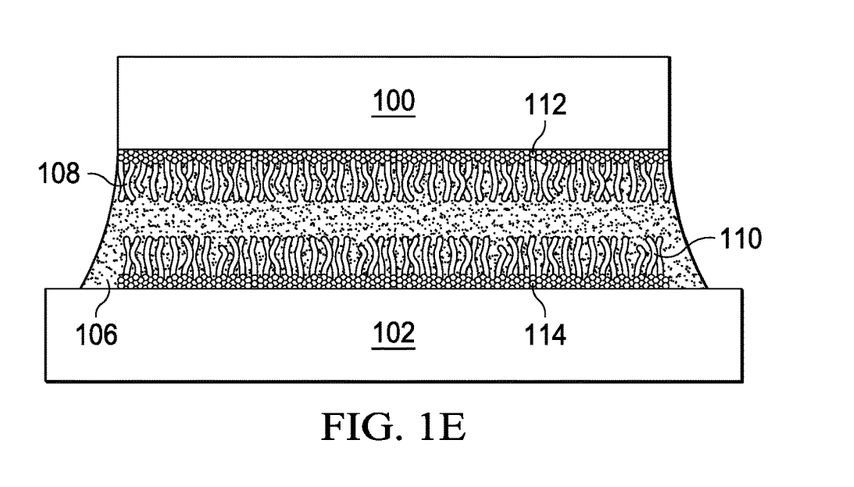
Figure 1F:
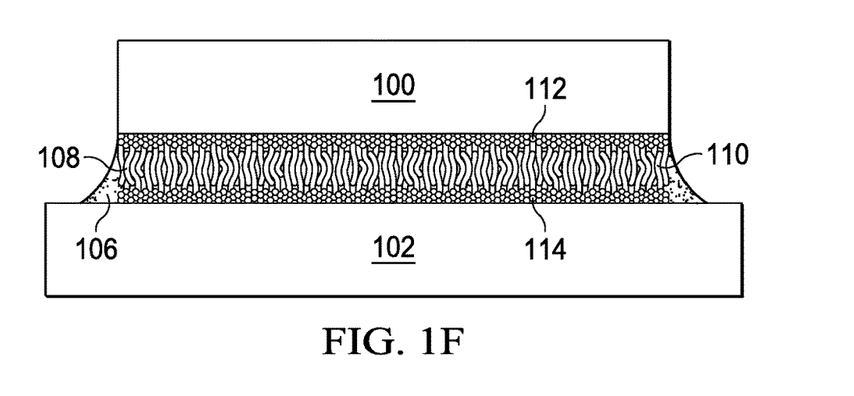

FIG. 1E depicts a structure that is identical to that of FIG. 1C, except that the metal layer 104 is omitted. FIG. 1F depicts a structure that is identical to that of FIG. 1E, except that the set of nanowires 108 includes one or more nanowires that fuses to one or more nanowires in the set of nanowires 110.

As explained above, although the nanowire interfaces described herein are usable to couple together any number of components in any of a variety of contexts, the semiconductor context is particularly described herein as an example context in which such nanowire interfaces may be deployed. Accordingly, FIGS. 2A1-2G2, which depict an example process flow for fabricating at least part of a nanowire interface on a semiconductor die (e.g., silicon die), and FIGS. 3A-3C, which depict an example process flow for assembling a semiconductor package comprising a nanowire interface, are now described.

Figure 2A:
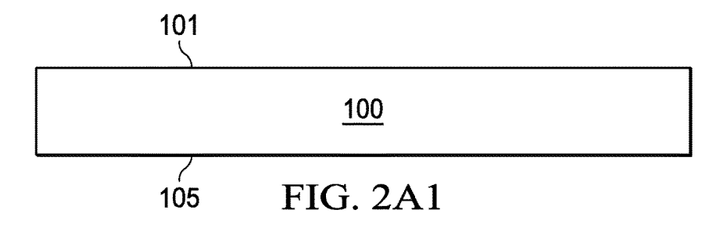
Figure 2A:
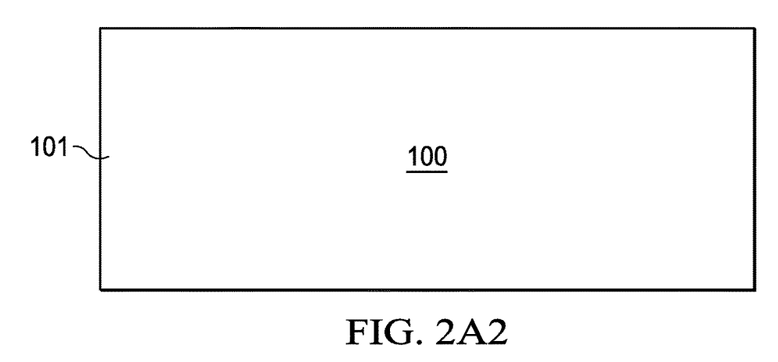

FIG. 2A1 depicts a profile view of a component 100, which, for the remainder of this discussion, will be referred to as a semiconductor die 100. The semiconductor die 100 may comprise, e.g., silicon or another suitable semiconductor. The semiconductor die 100 may have been singulated from a larger semiconductor wafer (not expressly shown). The semiconductor die 100 includes surfaces 101 and 105 opposite each other. FIG. 2A2 depicts a top-down view of the semiconductor die 100. In at least some examples, the surface 101 is an inactive surface (e.g., backside) of the die, and surface 105 is an active surface of the die.

Figure 2B:
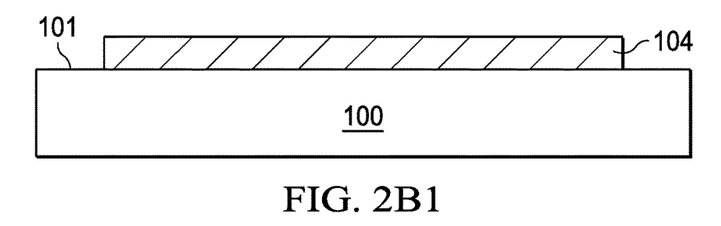
Figure 2B:
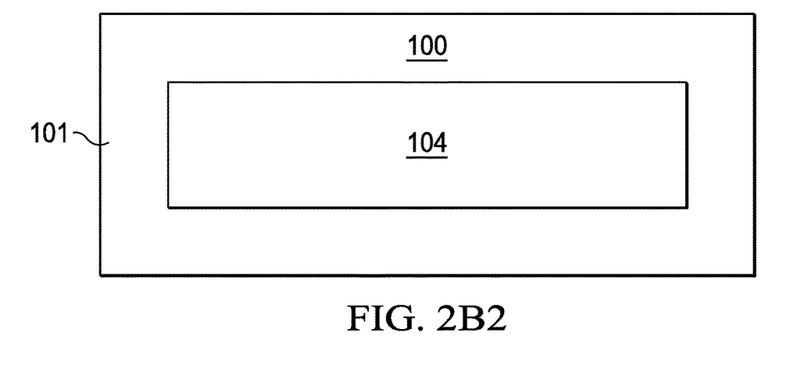

FIG. 2B1 depicts the semiconductor die 100 having the aforementioned metal layer 104 positioned on the surface 101. This description assumes that the metal layer 104 comprises a solid metal layer, for example the solid metal layer described above. However, as explained, in other examples the metal layer 104 may comprise other types of metal layers. In some examples, the metal layer 104 comprises copper, titanium, titanium-tungsten, or nickel palladium, but any of a variety of metals or metal alloys may be used. The physical dimensions of the metal layer 104 may be chosen as desired. FIG. 2B2 depicts a top-down view of the semiconductor die 100.

FIG. 2C1 depicts the semiconductor die 100 having the set of nanoparticles 112 positioned on the metal layer 104. In some examples, the set of nanoparticles 112 has a thickness ranging from 100 nanometers (nm) to 100 microns, with a thicker set of nanoparticles 112 resulting in a more mechanically stable nanowire interface 103 (FIGS. 1A-1F) and nanowires in the set of nanowires 108 (FIGS. 1A-1F) that are more firmly embedded in the set of nanoparticles 112. The remaining dimensions of the set of nanoparticles 112 may be chosen as desired. In some examples, each nanoparticle in the set of nanoparticles is generally spherical and has a diameter ranging from approximately 0.01 microns to 1.5 microns. The specific physical parameters of the set of nanoparticles and the individual nanoparticles within the set of nanoparticles may vary, and all such variations are encompassed within the scope of this disclosure. FIG. 2C2 depicts a top-down view of the structure of FIG. 2C1.

Figure 2C:
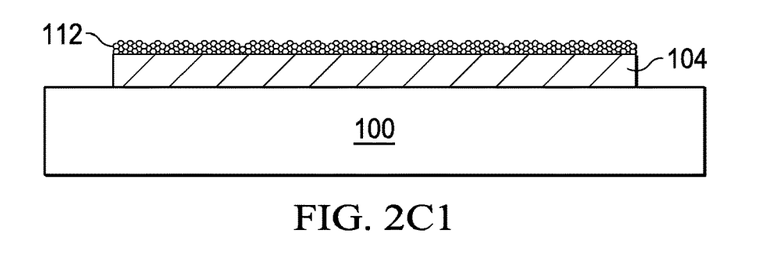
Figure 2C:
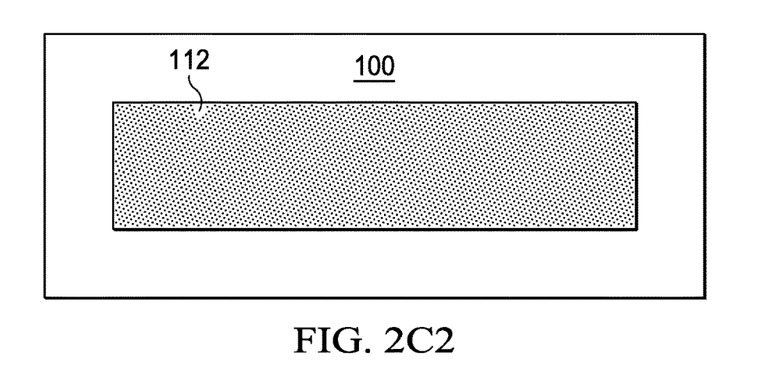

In some examples, the set of nanoparticles 112 is deposited on the metal layer 104 using a printing technique, for example an additive manufacturing technique. In some examples, the set of nanoparticles 112 is electroplated onto the metal layer 104. In some examples, the set of nanoparticles 112 is deposited using a sputtering technique. Other techniques are contemplated and included in the scope of this disclosure. After the set of nanoparticles 112 is deposited onto the metal layer 104, the set of nanoparticles 112 is melted to cause the nanoparticles in the set of nanoparticles 112 to diffuse into the metal layer 104, as described above. The diameter of the nanoparticles in the set of nanoparticles 112, as well as the thickness of the set of nanoparticles 112, may determine the melting point of the set of nanoparticles 112. In some examples, a nanoparticle diameter of approximately 1 micron and a thickness for the set of nanoparticles 112 of approximately 100 nm may result in a melting point of approximately 200 degrees Fahrenheit, although the specific number can vary based on a variety of factors (e.g., metal used, physical parameters of the nanoparticles in the set of nanoparticles 112).

Figure 2D:
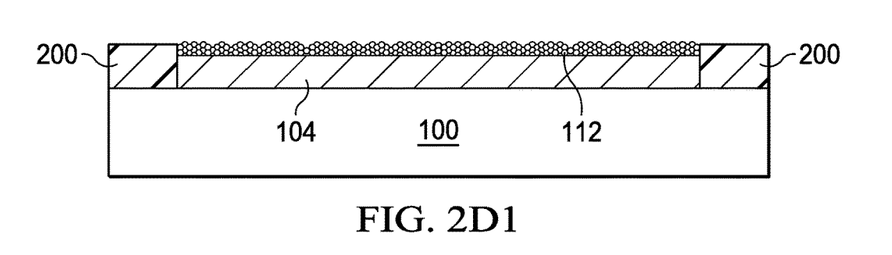
Figure 2D:
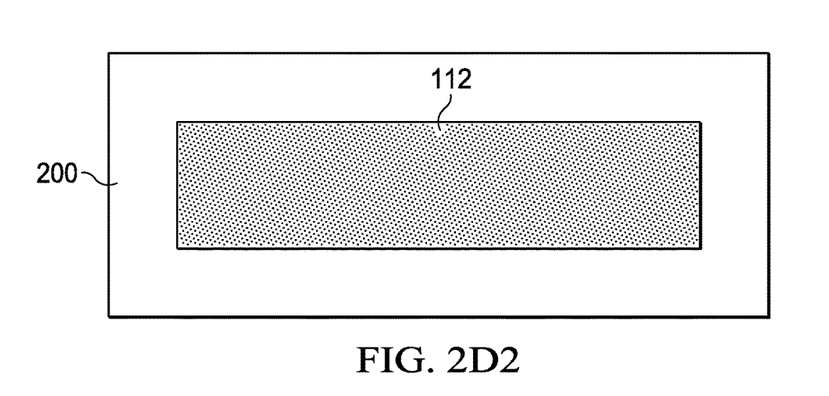

FIG. 2D1 depicts the semiconductor die 100 having a photoresist 200 positioned as shown, abutting the semiconductor die 100, the set of nanoparticles 112, and the metal layer 104. The photoresist 200 may be formed as shown using typical photolithography processes. In some examples, the photoresist 200 has a thickness that is approximately equal to the combined thickness of the set of nanoparticles 112 and the metal layer 104. FIG. 2D2 depicts a top-down view of the structure of FIG. 2D1.

Figure 2E:
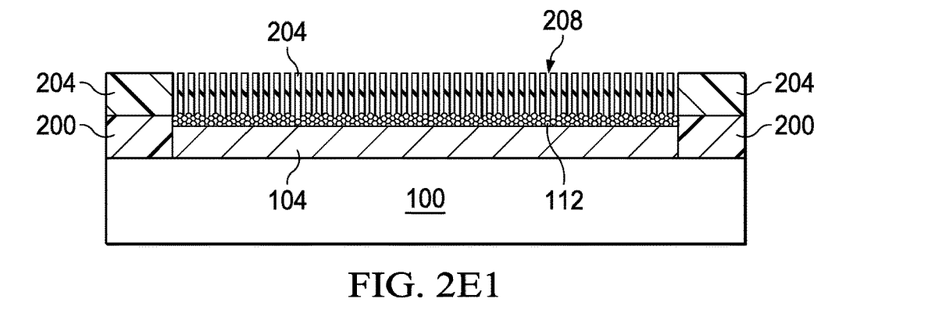
Figure 2E:
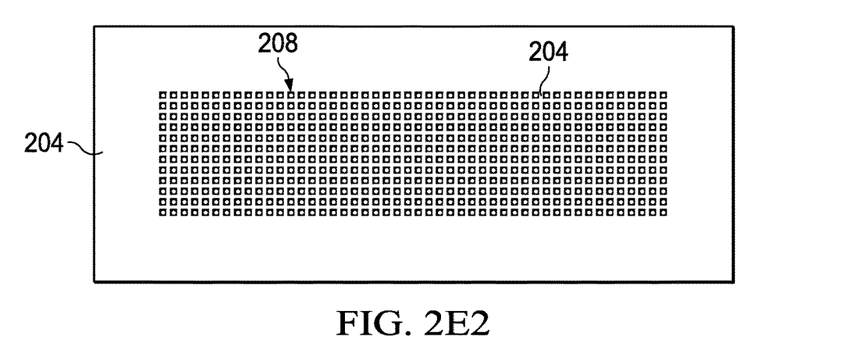

FIG. 2E1 depicts the structure of FIG. 2D1, but with a nanowire template 204 positioned on the photoresist 200 and the set of nanoparticles 112. The nanowire template 204 includes a plurality of orifices 208 extending perpendicular to the metal layer 104. This nanowire template 204 may comprise, for example, a TEFLON® (polytetrafluoroethylene) filter. In other examples, the nanowire template 204 comprises plastic. In some examples, the nanowire template 204 comprises any suitable type of metal (e.g., anodized aluminum or nickel). The nanowire template 204 rests on the photoresist 200 and on the set of nanoparticles 112 as shown. The photoresist 200 is not needed to mechanically support the nanowire template 204. Because the set of nanoparticles 112 and the metal layer 104 are negligibly thin in actual implementation, the nanowire template 204 may simultaneously rest on the semiconductor die 100 and the set of nanoparticles 112 in the absence of the photoresist 200. Rather, the photoresist 200 is present in some examples to adhere to the nanowire template 204 in the event that the nanowire template 204 is composed of a material that does not adhere firmly to the semiconductor die 100. If the nanowire template 204 is composed of a material that adheres firmly to the semiconductor die 100, the photoresist 200 may be omitted. FIG. 2E2 depicts a top-down view of the structure of FIG. 2E1.

Figure 2F:
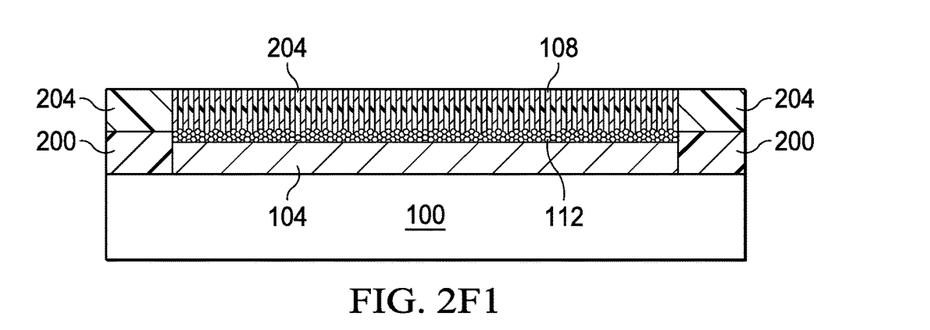
Figure 2F:
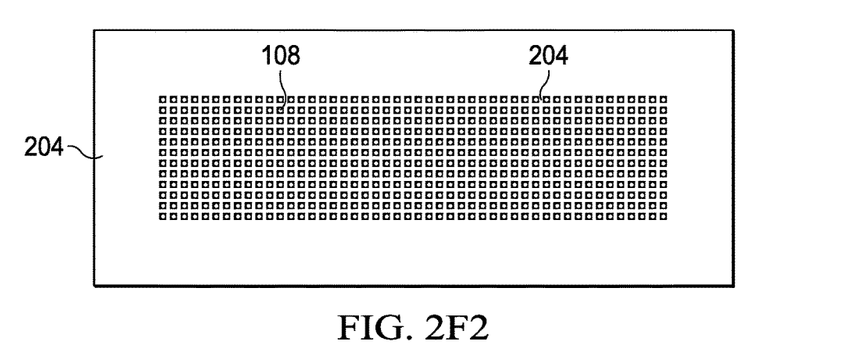

FIG. 2F1 depicts the structure of FIG. 2E1, but with a set of nanowires 108 positioned in the orifices 208 of FIG. 2E1. The set of nanowires 108 is plated (e.g., electroplated) on top of the set of nanoparticles 112. Any suitable metal may be used when plating the set of nanowires 108. In some examples, gold is used to plate the set of nanowires 108. In some examples, copper is used to plate the set of nanowires 108. In some examples, titanium is used to plate the set of nanowires 108. In some examples, tungsten is used to plate the set of nanowires 108. Example dimensions of the nanowires in the set of nanowires 108 are provided above and, thus, are not repeated here. FIG. 2F2 depicts a top-down view of the structure of FIG. 2F1.

Figure 2G:
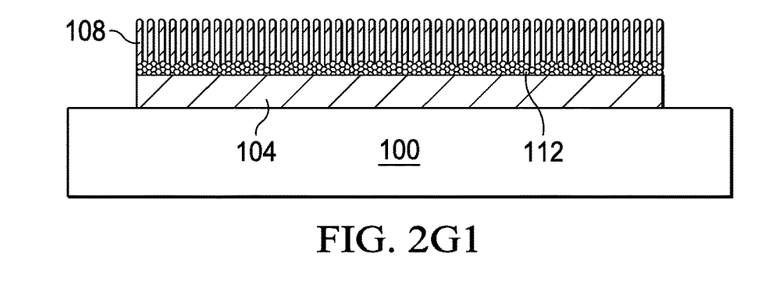
Figure 2G:
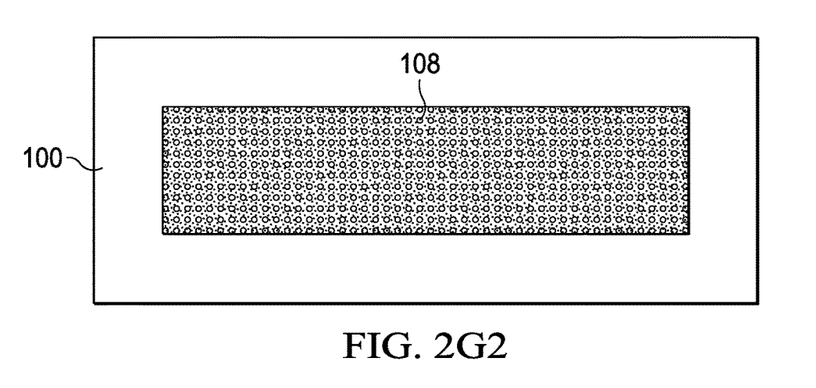

In FIG. 2G1, the photoresist 200 and the nanowire template 204 are removed. For example, the photoresist 200 may be removed using a resist stripping technique (e.g., wet or dry etching). The nanowire template 204 may be removed, for example, using the same resist stripping technique as used for the photoresist 200 (in the case of a TEFLON® or plastic nanowire template 204) or using a specific metal etch corresponding to the metal of which the nanowire template 204 is composed. Removal of the photoresist 200 and the nanowire template 204 leaves the structure shown in FIG. 2G1, which includes the semiconductor die 100, metal layer 104, set of nanoparticles 112, and set of nanowires 108 plated on the set of nanoparticles 112. FIG. 2G2 depicts a top-down view of the structure of FIG. 2G1.

The process flow as depicted in FIGS. 2A1-2G2 produces, for example, the semiconductor die 100, metal layer 104, set of nanoparticles 112, and set of nanowires 108 as depicted in FIGS. 1C and 1D. However, in some examples, the process flow of FIGS. 2A1-2G2 may be modified to add or remove specific physical features to or from the structure that would otherwise result from the process flow. For example, referring to FIGS. 1C and 1D, the process flow of FIGS. 2A1-2G2 may be modified (including removal of the steps relating to metal layer 104) to provide or produce the component 102 (which, for the remainder of this discussion, will be assumed to be a lead frame die pad 102), set of nanoparticles 114, and set of nanowires 110. Such a modified process flow also may be used, for example, to provide or produce the semiconductor die 100, set of nanoparticles 112, and set of nanowires 108 as depicted in FIGS. 1E and 1F, as well as the lead frame die pad 102, set of nanoparticles 114, and set of nanowires 110 depicted in those same figures. Similarly, the process flow of FIGS. 2A1-2G2 may be modified (including removal of the steps associated with the deposition of nanoparticles) to produce, e.g., the semiconductor die 100, metal layer 104, and set of nanowires 108 as depicted in FIGS. 1A and 1B. Similarly, steps associated with the deposition of nanoparticles and metal layers may be omitted from the process flow of FIGS. 2A1-2G2 as part of a modification to that process flow to provide or produce, e.g., the lead frame die pad 102 and the set of nanowires 110 as depicted in FIGS. 1A and 1B. Any and all such variations and modifications are contemplated and included in the scope of this disclosure. Accordingly, the process flow of FIGS. 2A1-2G2 and modified versions thereof may be used to produce at least the various examples of FIGS. 1A-1F.

Figure 3A:
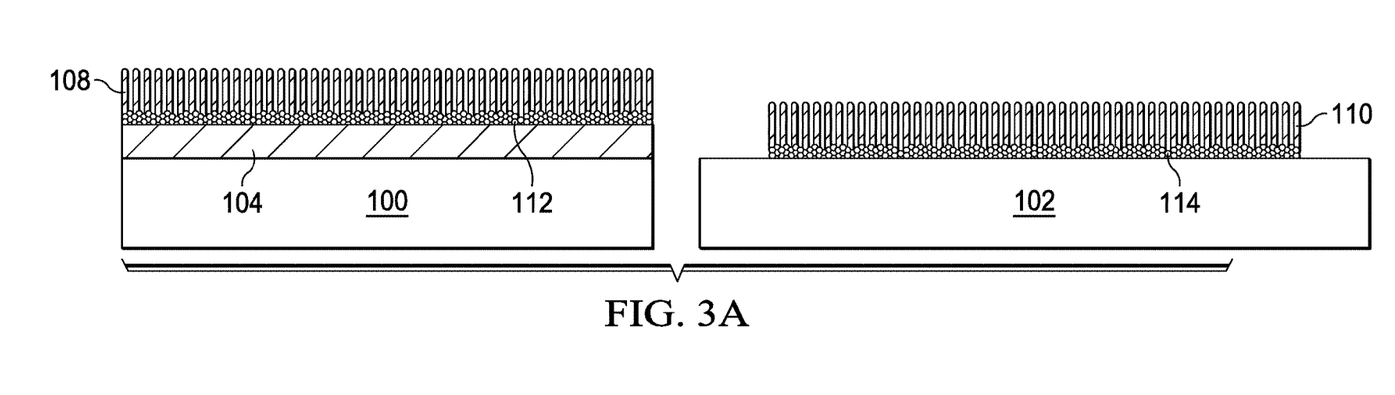
FIGS. 3A-3C depict a process flow for assembling a semiconductor package comprising a nanowire interface, in accordance with various examples.
Figure 3B:
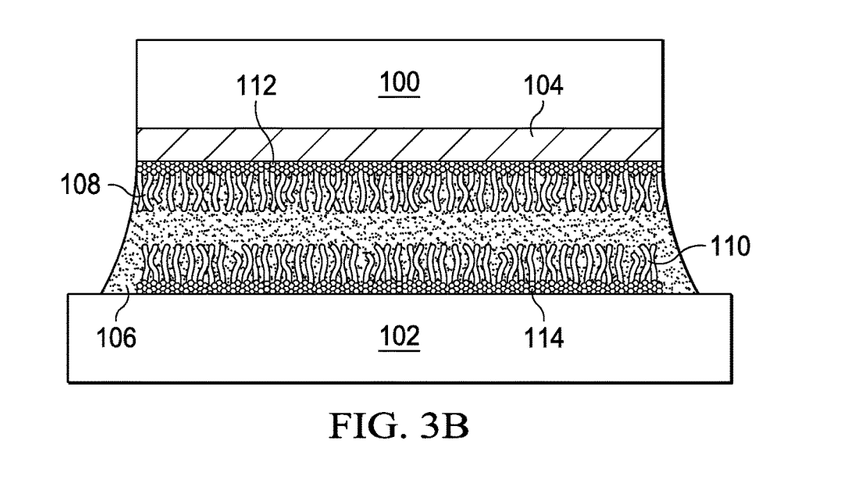
Figure 3C:
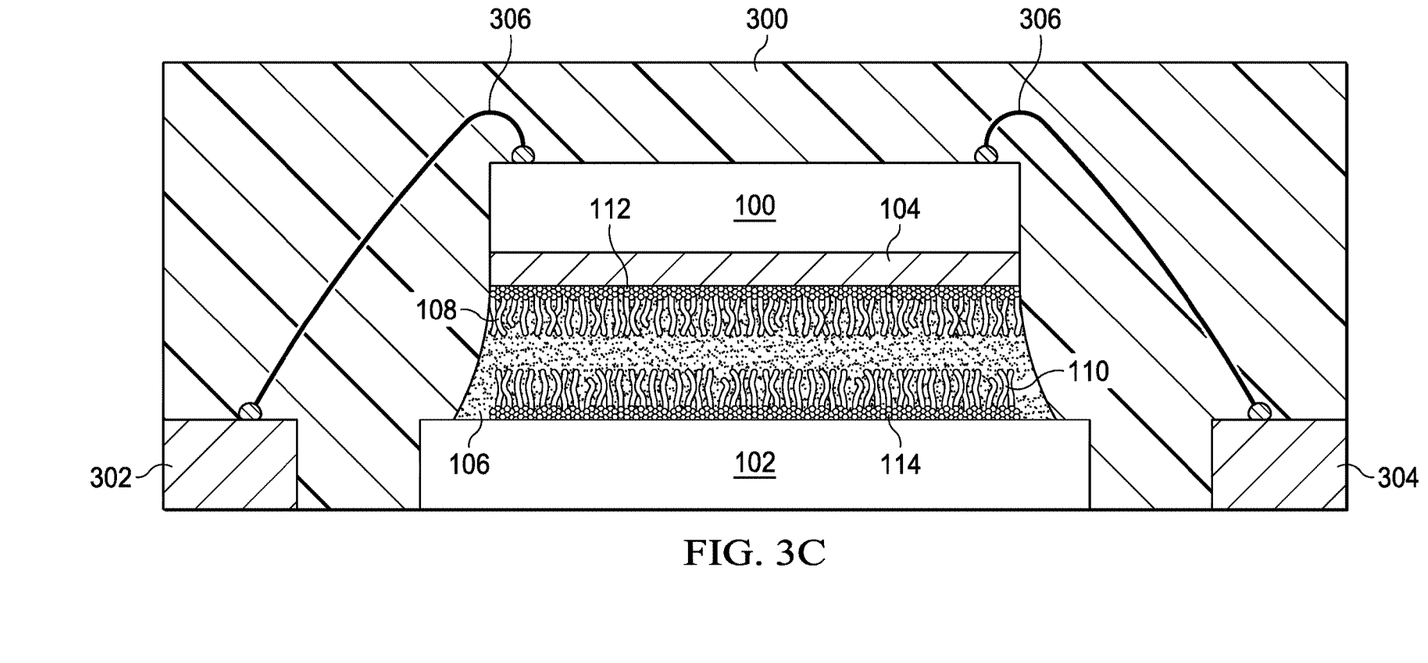

FIGS. 3A-3C depict an assembly process flow usable to produce a semiconductor package comprising a nanowire interface. The techniques described above with respect to FIGS. 2A1-2G2 (or modified versions thereof) may be used to produce the structures depicted in FIG. 3A. In particular, FIG. 3A depicts a semiconductor die 100 having a metal layer 104 and set of nanoparticles 112 stacked thereupon, with a set of nanowires 108 extending from the set of nanoparticles 112. In addition, FIG. 3A depicts a lead frame die pad 102 having a set of nanoparticles 114 positioned thereupon, with a set of nanowires 110 extending from the set of nanoparticles 114. In FIG. 3B, the two structures of FIG. 3A are coupled together using an adhesive layer 106, as shown. In some examples, the adhesive layer 106 is applied to the set of nanowires 110 and the set of nanoparticles 114 before the structure containing the semiconductor die 100 is applied to the adhesive layer 106. This produces a structure such as that shown in FIG. 3B, in which the sets of nanowires 108, 110 are not in contact with each other. In other examples, the two structures shown in FIG. 3A are coupled to each other such that the sets of nanowires 108, 110 are fused together, and the adhesive layer 106 is subsequently injected between the sets of nanowires 108, 110. In FIG. 3C, the active surface of the semiconductor die 100 as shown in FIG. 3B is wirebonded using bond wires 306 to conductive terminals (e.g., leads) 302, 304 that are exposed to an exterior surface of the semiconductor package, thereby producing a structure that is subsequently covered using a mold compound or epoxy 300.

Figure 4:
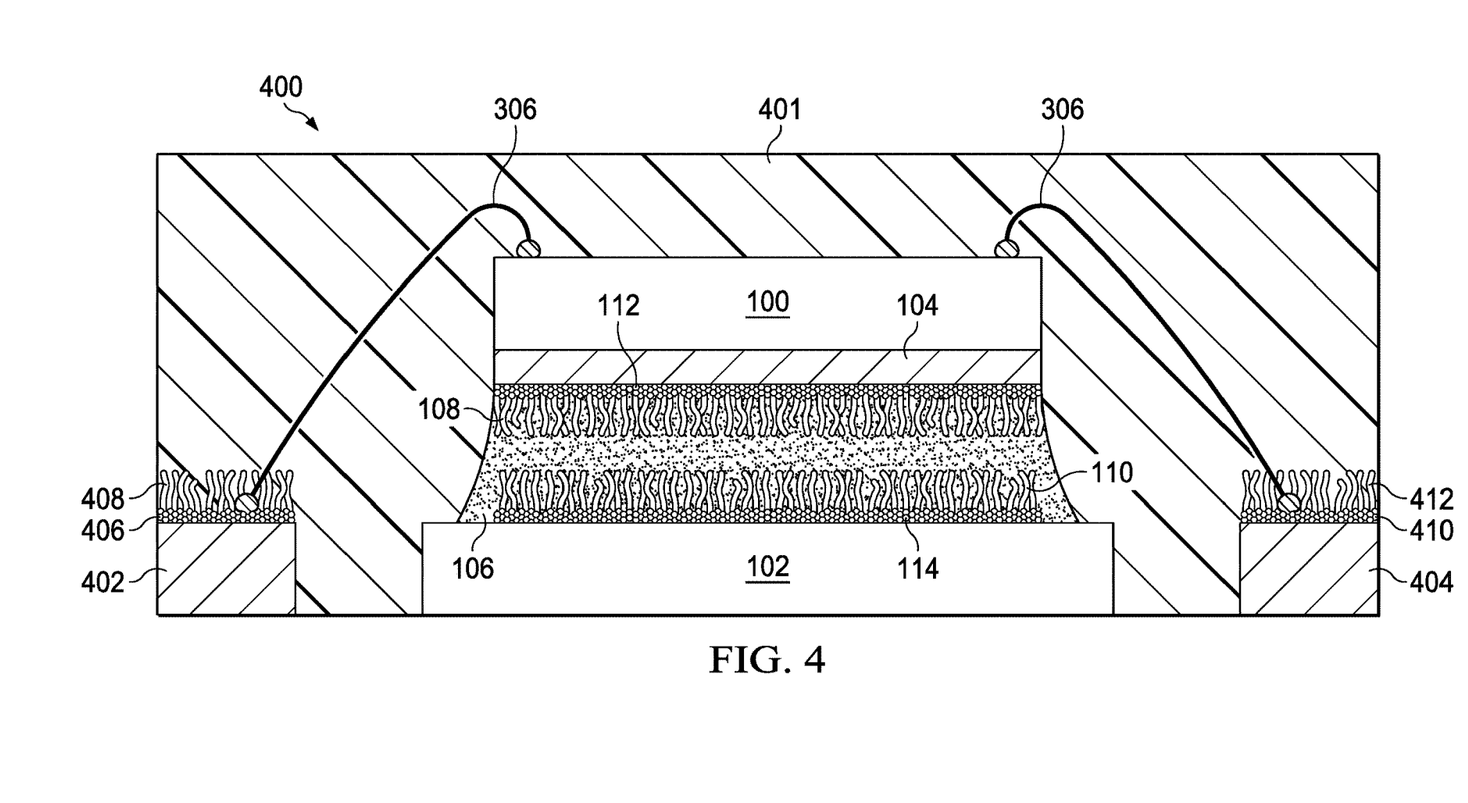
FIGS. 4 and 5 depict semiconductor packages comprising nanowire interfaces, in accordance with various examples.

The process flows described above with respect to FIGS. 2A1-2G2 and FIGS. 3A-3C may be applied to other components besides semiconductor dies and lead frame die pads. For example, conductive terminals (e.g., leads) may be subjected to the process flows described above such that the conductive terminals have sets of nanoparticles, metal layers, and/or sets of nanowires formed thereupon. FIG. 4 depicts such a semiconductor package 400 in which the process flows described above are used to produce a conductive terminal 402 having a set of nanoparticles 406 positioned thereupon and a set of nanowires 408 extending from the set of nanoparticles 406. The bond wire 306 may be coupled to one or more of the nanowires in the set of nanowires 408 and/or to the set of nanoparticles 406. One advantage to such a conductive terminal 402 is that the set of nanowires 408 effectively increases the surface area of the conductive terminal 402 that couples to the mold compound 401, thereby strengthening the adhesion between the conductive terminal 402 and the mold compound 401. Similarly, the process flows described above may be applied to produce a conductive terminal 404 having a set of nanoparticles 410 positioned thereupon and a set of nanowires 412 extending from the set of nanoparticles 410. A bond wire 306 couples to the set of nanoparticles 410 and/or the set of nanowires 412 and to an active surface of the semiconductor die 100.

Figure 5:
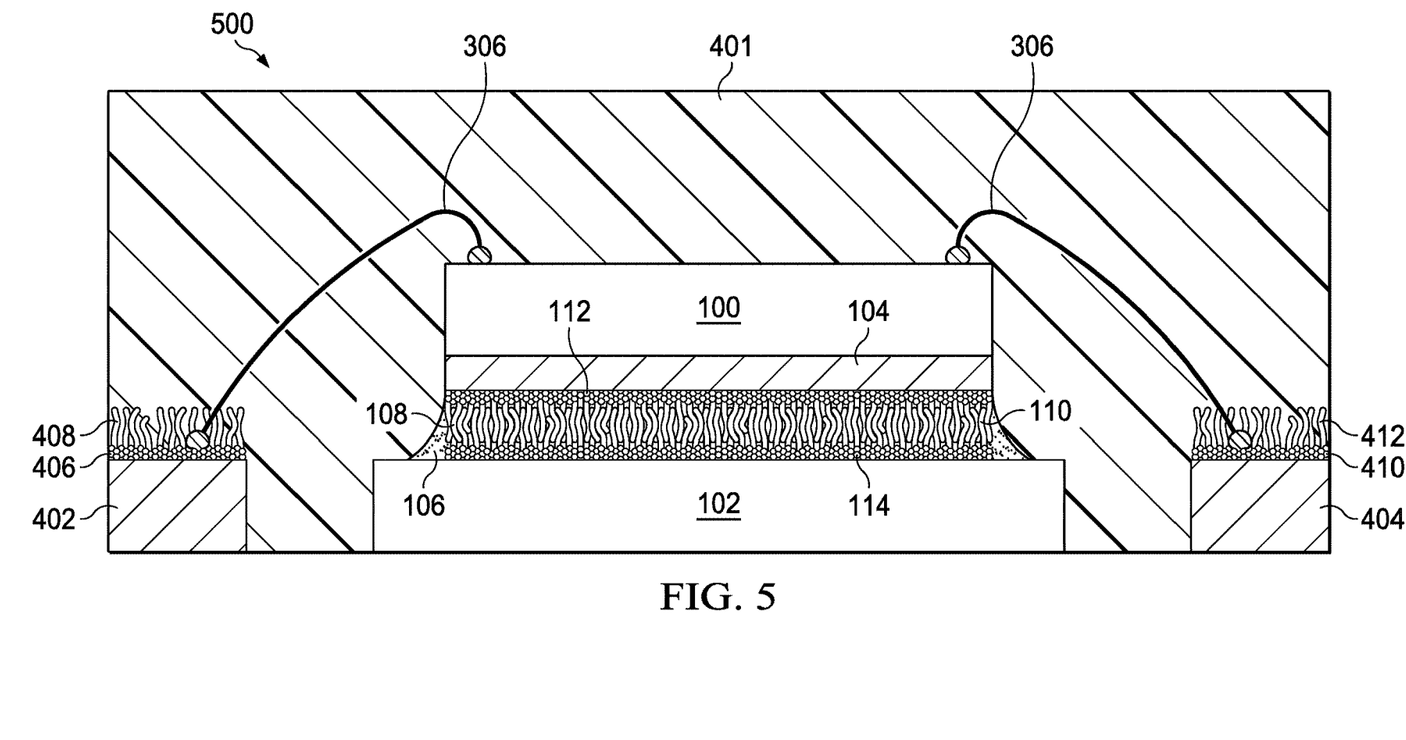

FIG. 5 depicts a semiconductor package 500 that is identical to the semiconductor package 400 (FIG. 4) but in which the sets of nanowires 108, 110 couple to (e.g., are fused to) each other, as described above.

Figure 6:
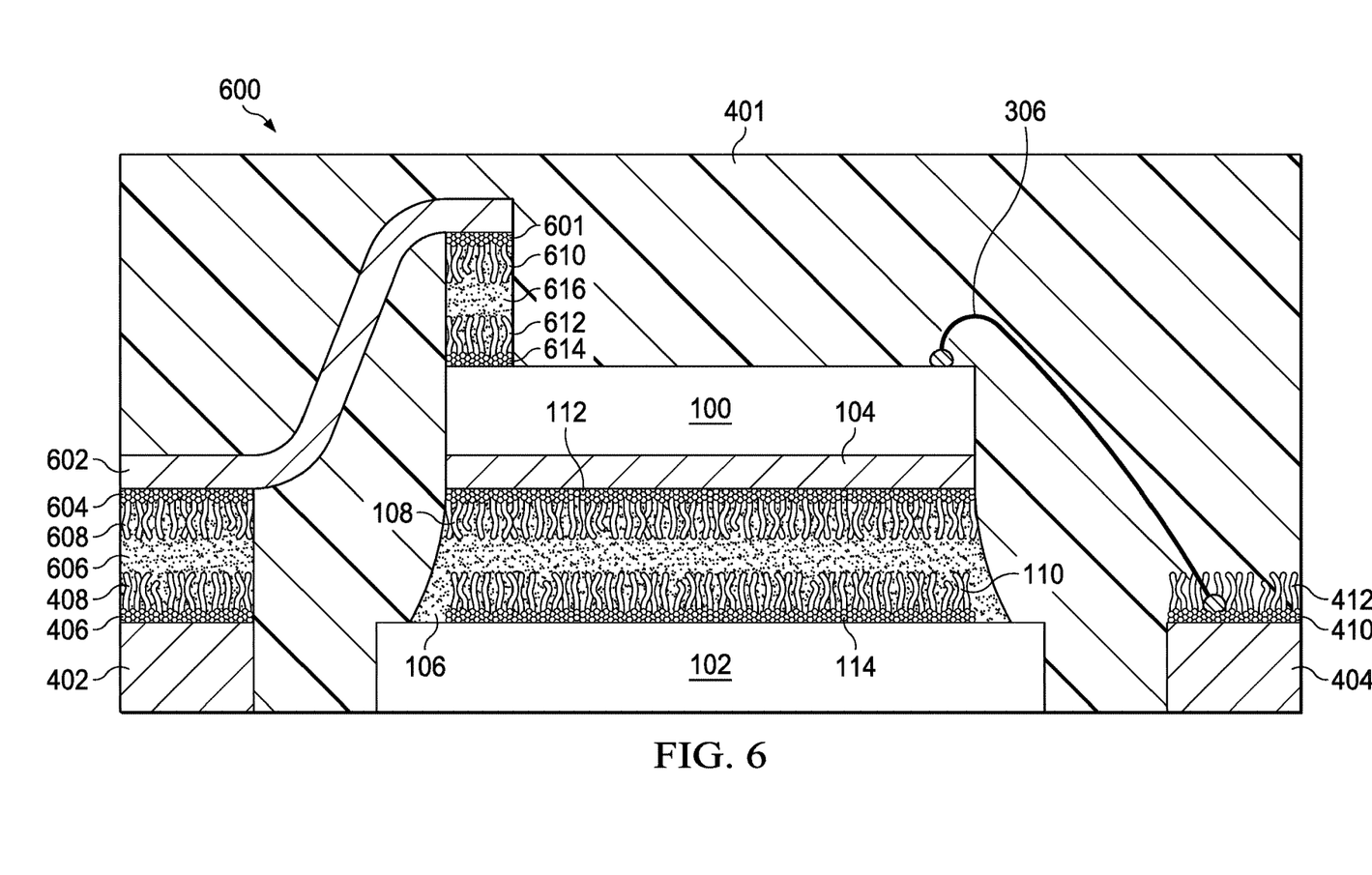
FIG. 6 depicts a semiconductor package comprising nanowire interfaces coupled to a clip, in accordance with various examples.

FIG. 6 depicts a semiconductor package 600 comprising nanowire interfaces coupled to a clip, in accordance with various examples. The semiconductor package 600 is identical to the semiconductor package 400 (FIG. 4), except that one of the bond wires 306 of the semiconductor package 400 is replaced with a clip 602 that couples the conductive terminal 402 to an active surface of the semiconductor die 100. The clip 602 couples to the conductive terminal 402 by way of a set of nanoparticles 604, a set of nanowires 608, an adhesive layer 606, the set of nanowires 408, and the set of nanoparticles 406. Similarly, the clip 602 couples to the active surface of the semiconductor die 100 by way of a set of nanoparticles 601, a set of nanowires 610, an adhesive layer 616, a set of nanowires 612, and a set of nanoparticles 614. The sets of nanoparticles, sets of nanowires, and adhesive layers may have one or more physical features (e.g., composition, thickness, length, width, etc.) similar to those of the sets of nanoparticles, sets of nanowires, and adhesive layers described above.

Figure 7:
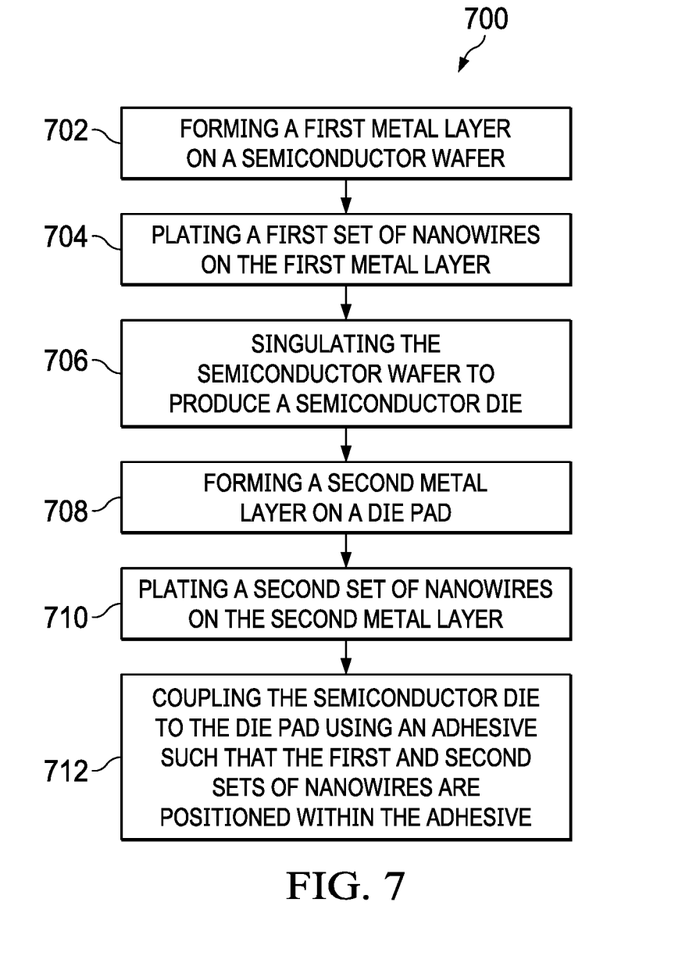
FIG. 7 depicts a flow diagram of a method for fabricating a semiconductor package comprising a nanowire interface, in accordance with various examples.

FIG. 7 depicts a flow diagram of a method 700 for fabricating a semiconductor package comprising a nanowire interface, in accordance with various examples. The method 700 comprises forming a first metal layer (e.g., a solid metal layer, a set of nanoparticles) on a semiconductor wafer (702). The method 700 comprises plating a first set of nanowires on the first metal layer (704). The method 700 comprises singulating the semiconductor wafer to produce a semiconductor die (706). In some examples, the application of the first metal layer and the plating of the nanowires may occur on a post-singulation semiconductor die. The method 700 comprises forming a second metal layer on a semiconductor die pad (708). The method 700 comprises plating a second set of nanowires on the second metal layer (710). The method 700 comprises coupling the semiconductor die to the die pad using an adhesive such that the first and second sets of nanowires are positioned within the adhesive (712). The method 700 may be modified as desired, including by adding, deleting, modifying, or rearranging one or more steps.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
   a first component having a first surface;
   a first set of nanoparticles coupled to the first surface;
   a first set of nanowires extending from the first set of nanoparticles;
   a second component having a second surface;
   a second set of nanoparticles coupled to the second surface;
   a second set of nanowires extending from the second set of nanoparticles; and
   an adhesive positioned between the first and second surfaces, the first and second sets of nanowires positioned within the adhesive.

2. The system of claim 1, further comprising a metal layer positioned on the first surface, the first set of nanoparticles positioned on the metal layer.

3. The system of claim 1, further comprising a metal layer positioned on the second surface, the second set of nanoparticles positioned on the metal layer.

4. The system of claim 1, wherein the adhesive is selected from the group consisting of a glue, an epoxy, and solder.

5. The system of claim 1, wherein the first component comprises a semiconductor die and the second component comprises a lead frame die pad.

6. The system of claim 1, wherein a nanowire of the first set of nanowires has a length-to-width ratio of at least 2 to 1.

7. The system of claim 1, wherein a nanowire of the first set of nanowires has a diameter ranging between 0.5 microns and 1.5 microns.

8. The system of claim 1, wherein a nanoparticle of the first set of nanoparticles has a diameter ranging between 0.01 microns and 1.5 microns.

9. The system of claim 1, further comprising a third component coupled to the first component, the third component having a third set of nanowires coupled thereto.

10. A system, comprising:
    a first set of nanoparticles coupled to a first component;
    a first set of nanowires extending from the first set of nanoparticles;
    a second set of nanoparticles coupled to a second component;
    a second set of nanowires extending from the second set of nanoparticles; and
    an adhesive positioned between the first and second components, the first and second sets of nanowires positioned within the adhesive.

11. The system of claim 10, further comprising a metal layer positioned on the first component, the first set of nanoparticles positioned on the metal layer.

12. The semiconductor package of claim 11, wherein the metal layer comprises a set of nanoparticles.

13. The semiconductor package of claim 11, wherein the metal layer is a solid metal layer.

14. The system of claim 10, further comprising a metal layer positioned on the second component, the second set of nanoparticles positioned on the metal layer.

15. The semiconductor package of claim 14, wherein the metal layer comprises a set of nanoparticles.

16. The semiconductor package of claim 14, wherein the metal layer is a solid metal layer.

17. The system of claim 10, wherein the adhesive is selected from the group consisting of a glue, an epoxy, and solder.

18. The system of claim 10, wherein the first component comprises a
semiconductor die and the second component comprises a lead frame die pad.

19. The system of claim 10, wherein a nanowire of the first set of nanowires has a length-to-width ratio of at least 2 to 1.

20. The system of claim 10, wherein a nanowire of the first set of nanowires has a diameter ranging between 0.5 microns and 1.5 microns.

21. The system of claim 10, wherein a nanoparticle of the first set of
nanoparticles has a diameter ranging between 0.01 microns and 1.5 microns.

22. The system of claim 10, further comprising a third component coupled to the first component, the third component having a third set of nanowires coupled thereto.

\* \* \* \* \*